United States Patent
Chuang et al.

(10) Patent No.: US 9,502,533 B2
(45) Date of Patent: *Nov. 22, 2016

(54) SILICON RECESS ETCH AND EPITAXIAL DEPOSIT FOR SHALLOW TRENCH ISOLATION (STI)

(71) Applicant: Taiwan Semiconductor Manufacturing Co., Ltd., Hsin-Chu (TW)

(72) Inventors: Harry-Hak-Lay Chuang, Zhubei (TW); Bao-Ru Young, Zhubei (TW); Wei Cheng Wu, Zhubei (TW); Kong-Pin Chang, Caotun Township (TW); Chia Ming Liang, Taipei (TW); Meng-Fang Hsu, Hsinchu (TW); Ching-Feng Fu, Taichung (TW); Shih-Ting Hung, Sanchong (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/835,958

(22) Filed: Aug. 26, 2015

(65) Prior Publication Data

US 2015/0364575 A1 Dec. 17, 2015

Related U.S. Application Data

(63) Continuation of application No. 13/854,507, filed on Apr. 1, 2013, now Pat. No. 9,129,823.

(60) Provisional application No. 61/792,327, filed on Mar. 15, 2013.

(51) Int. Cl.
*H01L 21/78* (2006.01)
*H01L 29/66* (2006.01)
(Continued)

(52) U.S. Cl.
CPC ... *H01L 29/66651* (2013.01); *H01L 21/76224* (2013.01); *H01L 21/823431* (2013.01);
(Continued)

(58) Field of Classification Search
CPC .................. H01L 29/66651; H01L 21/76224; H01L 21/823431; H01L 27/0886; H01L 29/0649; H01L 29/7851; H01L 29/7833; H01L 29/6645; H01L 2924/00; H01L 29/165; H01L 21/8234; H01L 21/31; H01L 27/0866
See application file for complete search history.

(56) References Cited

U.S. PATENT DOCUMENTS 5,530,713 A * 6/1996 Fukagai ................. B82Y 20/00
257/18
6,804,095 B2 10/2004 Kunz et al.
(Continued)

OTHER PUBLICATIONS

Non-Final Office Action dated Sep. 30, 2014 for U.S. Appl. No. 13/854,507.
(Continued)

*Primary Examiner* — Yosef Gebreyesus
(74) *Attorney, Agent, or Firm* — Eschweiler & Associates, LLC

(57) ABSTRACT

Some embodiments of the present disclosure relate to a method. In this method, a semiconductor substrate, which has an active region disposed in the semiconductor substrate, is received. A shallow trench isolation (STI) structure is formed to laterally surround the active region. An upper surface of the active region bounded by the STI structure is recessed to below an upper surface of the STI structure. The recessed upper surface extends continuously between inner sidewalls of the STI structure and leaves upper portions of the inner sidewalls of the STI structure exposed. A semiconductor layer is epitaxially grown on the recessed surface of the active region between the inner sidewalls of the STI structure. A gate dielectric is formed over the epitaxially-grown semiconductor layer. A conductive gate electrode is formed over the gate dielectric.

20 Claims, 10 Drawing Sheets

(51) Int. Cl.
*H01L 29/06* (2006.01)
*H01L 21/762* (2006.01)
*H01L 21/8234* (2006.01)
*H01L 27/088* (2006.01)
*H01L 29/78* (2006.01)

(52) U.S. Cl.
CPC ... *H01L21/823481* (2013.01); *H01L 27/0886* (2013.01); *H01L 29/0649* (2013.01); *H01L 29/7851* (2013.01); *H01L 29/7833* (2013.01)

(56) References Cited

U.S. PATENT DOCUMENTS

| | | | |
|---|---|---|---|
| 7,015,106 B2 * | 3/2006 | Yoon | H01L 21/823437 257/E21.703 |
| 7,118,975 B2 | 10/2006 | Han et al. | |
| 7,183,593 B2 | 2/2007 | Yeo et al. | |
| 7,589,384 B2 | 9/2009 | Kinoshita | |
| 7,646,068 B2 | 1/2010 | Ko et al. | |
| 9,129,823 B2 * | 9/2015 | Chuang | H01L 29/0649 |
| 2005/0020075 A1 | 1/2005 | Lee | |
| 2005/0077568 A1 | 4/2005 | Park et al. | |
| 2005/0112817 A1 | 5/2005 | Cheng et al. | |
| 2005/0121719 A1 | 6/2005 | Mori | |
| 2005/0202638 A1 * | 9/2005 | Yang | H01L 21/28123 438/275 |
| 2006/0255412 A1 | 11/2006 | Ramaswamy et al. | |
| 2006/0278607 A1 | 12/2006 | Nam | |
| 2007/0037312 A1 | 2/2007 | Noh | |
| 2007/0190741 A1 | 8/2007 | Lindsay | |
| 2008/0160695 A1 | 7/2008 | Shin | |
| 2010/0044802 A1 | 2/2010 | Ishibashi et al. | |
| 2010/0109088 A1 | 5/2010 | Ng et al. | |
| 2010/0163997 A1 * | 7/2010 | Drobny | H01L 21/28123 257/368 |
| 2011/0073960 A1 | 3/2011 | Causio et al. | |
| 2011/0278580 A1 | 11/2011 | Fuller et al. | |
| 2011/0291196 A1 | 12/2011 | Wei et al. | |
| 2012/0104498 A1 | 5/2012 | Majumdar et al. | |
| 2012/0309202 A1 | 12/2012 | Sasaki | |
| 2012/0322216 A1 | 12/2012 | Lee et al. | |
| 2013/0149830 A1 | 6/2013 | Rhee et al. | |
| 2013/0181185 A1 | 7/2013 | Cui et al. | |
| 2014/0183551 A1 * | 7/2014 | Kang | H01L 21/76224 257/77 |
| 2015/0214051 A1 * | 7/2015 | Kim | H01L 21/02636 257/192 |

OTHER PUBLICATIONS

Final Office Action dated Feb. 12, 2015 for U.S. Appl. No. 13/854,507.

Notice of Allowance dated Apr. 15, 2015 for U.S. Appl. No. 13/854,507.

* cited by examiner

SILICON RECESS ETCH AND EPITAXIAL DEPOSIT FOR SHALLOW TRENCH ISOLATION (STI)

REFERENCE TO RELATED APPLICATIONS

This application is a continuation of U.S. application Ser. No. 13/854,507 filed on Apr. 1, 2013, which claims priority to U.S. Provisional Application No. 61/792,327 filed on Mar. 15, 2013, the contents of both of these applications are incorporated by reference in their entirety.

BACKGROUND

Shallow trench isolations (STIs) are used to separate and isolate active areas on a semiconductor wafer from each other. STIs may be formed by etching trenches, overfilling the trenches with a dielectric such as an oxide, and then removing any excess dielectric with a process such as chemical mechanical polishing (CMP) or etching in order to remove the dielectric outside the trenches. This dielectric helps to electrically isolate the active areas from each other.

DETAILED DESCRIPTION

Figure 1A:
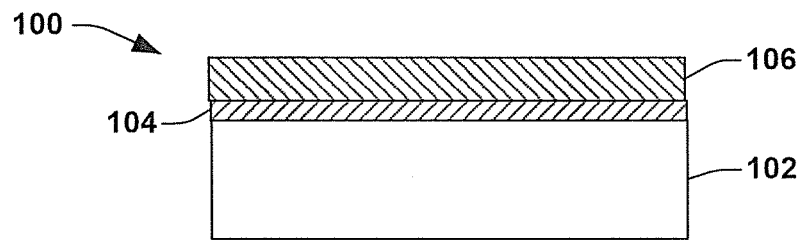
FIGS. 1A-1K are partial cross sectional views illustrating steps of one embodiment of forming a device in accordance with the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

The isolation of semiconductor devices on a single chip is an important aspect of modern metal-oxide-semiconductor (MOS) and bipolar integrated circuit technology for the separation of different devices or different functional regions. With the high integration of semiconductor device, improper electrical isolation among devices will cause current leakage, which in turn can consume a significant amount of power, as well as compromise functionality.

Shallow trench isolation (STI) is a preferred electrical isolation technique for a semiconductor chip with high integration. Conventional methods of producing a STI feature include forming a hard mask, for example silicon nitride, over a targeted trench layer including a thermally grown pad oxide layer and patterning a photoresist over the hard mask to define a trench feature. After patterning, etching is performed through the openings in the hard mask to create recesses in the silicon regions of the silicon substrate. An insulating material, such as oxide or other suitable material, is deposited in the recesses and on the hard mask. A chemical mechanical planarization (CMP) is then performed to remove the insulator material on top of the hard mask and planarize the top of the STI region. The chemical mechanical planarization stops on the hard mask. Following the planarization, the hard mask layer is removed from the top of the silicon substrate. When the hard mask is a nitride, for example, this is achieved by etching with hot phosphoric acid.

One problem associated with formation of the STI feature is that during the acidic wet etching processes to remove the hard mask layer and the pad oxide layer, over-etching frequently occurs leading to removal of exposed STI material during and after the hard mask layer and the pad oxide layer have been removed. The formation of such etching defects adversely affects the electrical integrity of semiconductor devices, including altering the threshold voltage of a field effect transistor (FET), altering the device off-state current, and making the device susceptible to reverse short channel effects.

FIGS. 1A-1K are cross-sectional views of the formation of trench isolation structures at various stages in the STI manufacturing process in accordance with various embodiments of the present disclosure. It will be understood for ease of illustration that while only one trench isolation structure is illustrated in the Figures, additional STI structures are usually formed on the semiconductor body 100 at the same time. Referring to FIG. 1A, a semiconductor body 100 including a semiconductor substrate 102 is illustrated. Substrate 102 is understood to include a semiconductor wafer or substrate, comprised of a semiconducting material such as silicon or germanium, or a silicon on insulator structure (SOI). A sacrificial oxide layer 104 is provided overlying substrate 102. In some embodiments, sacrificial oxide layer 104 is a pad oxide layer. Pad oxide layer 104 includes a silicon dioxide grown by a thermal oxidation process. For example, the pad oxide layer 104 can be grown in a rapid thermal oxidation process (RTO) or in a conventional annealing process including oxygen at a temperature of about 800° C. to about 1150° C. In some embodiments, the pad oxide layer 104 has a thickness of about 50 angstroms to about 200 angstroms. A hard mask layer 106 is formed over pad oxide layer 104. The hard mask layer 106 can be formed by a low pressure chemical vapor deposition (LPCVD) process. For example, the precursor including dichlorosilane (DCS or $SiH_2Cl_2$), bis(tertiarybutylamino) silane (BTBAS or $C_8H_{22}N_2Si$), or disilane (DS or $Si_2H_6$) is used in the CVD process to form the hard mask layer 106. The hard mask layer 106 can be silicon nitride or silicon oxynitride. In some embodiments, the hard mask layer 106 has a thickness ranging from about 400 angstroms to about 1500 angstroms.

Figure 1B:
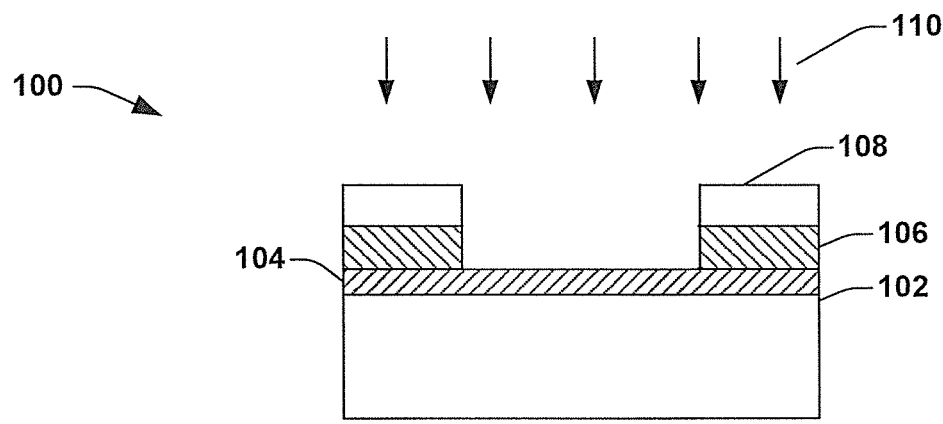

Following formation of the hard mask layer 106, a photoresist mask 108 is deposited and patterned by exposing the photoresist mask 108 to a light pattern and then performing a developing process. As shown in FIG. 1B, the hard mask layer 106 is patterned by anisotropically etching (shown as arrows 110) using the photoresist mask 108 as an etch mask. In some embodiments, a reactive ion etching (RIE) process is used to anisotropically etch through hard mask layer 106 and the pad oxide layer 104 into the semiconductor substrate 102 to form a trench 112. Subsequently, any remaining photoresist mask 108 is removed according to an ashing process (not shown), with the resulting structure as shown 100 in FIG. 1C.

Figure 1C:
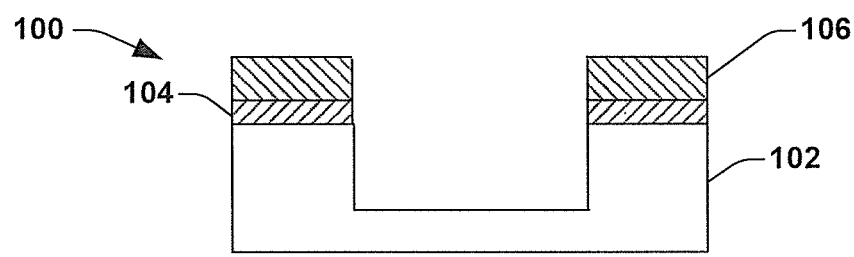
Figure 1D:
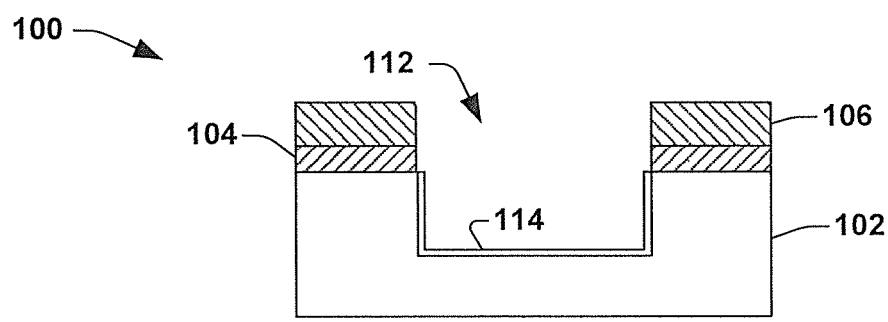

In FIG. 1D, following formation of the STI trench 112, in some embodiments, an insulating liner material 114 is thermally and conformally grown in the trench 112, along the bottom and at least a portion of the sidewalls. STI liner 114, in some embodiments, may be a silicon dioxide liner with a thickness up to about 300 angstroms. The STI liner 114 may be formed by oxidation using an oxygen gas, or oxygen containing gas mixture, to oxidize the silicon on the surface of the openings 112 of the STI. For example, the STI liner 114 may be formed by oxidizing the exposed silicon in an oxygen environment at a temperature from about 900° C. to about 1100° C. In some embodiments, an annealing process may be performed after the STI liner 114 is deposited to prevent crystalline defects due to the oxidation process.

Figure 1E:
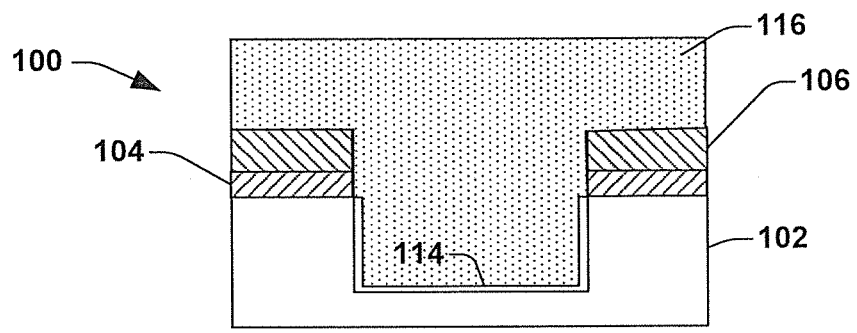

Referring to FIG. 1E, following formation of the STI liner 114, a CVD process is carried out to fill STI trench 112 with a dielectric material 116. In some embodiments, dielectric material 116 is silicon oxide. In various examples, the dielectric material 116 can be formed by a high density plasma chemical vapor deposition (HDPCVD). The dielectric material may be alternatively formed by a high aspect ratio process (HARP). Following deposition of the dielectric material 116, a conventional annealing process, for example, a rapid thermal annealing (RTA) process is optionally carried out, to densify the dielectric material 116 and to reduce its wet etch rate(s). The densification process can be performed in a furnace or a RTA chamber. In some embodiments, the process is performed at a temperature ranging from about 900° C. to about 1100° C. in an RTA chamber for a duration of about 10 seconds to about 1 minute.

Figure 1F:
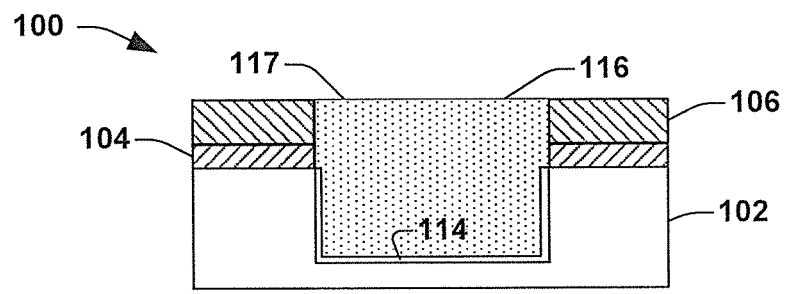

After trench 112 filling is completed, a CMP process is carried out in FIG. 1F to remove dielectric material 116 overlying the hard mask layer 106 and define filled trench 112 and top surface portion 117 of dielectric material 116. In some embodiments, the hard mask layer 106 may serve as a CMP polish stop where the CMP process is stopped on the hard mask layer 106. In some embodiments other processes may be used to achieve the similar polishing effect, for example, an etch-back process may be used to remove the dielectric material 116 overlying the hard mask layer 106.

Figure 1G:
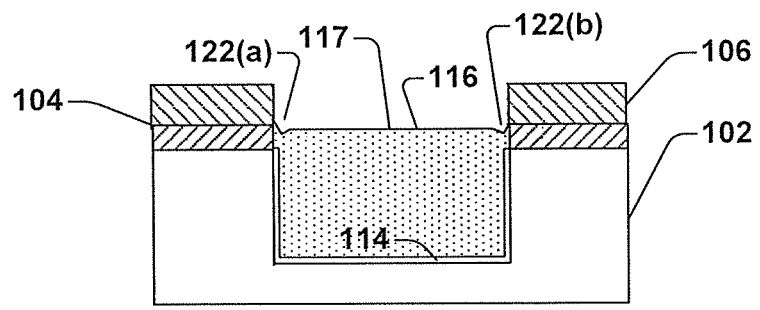

Following the CMP process, a wet oxide etch process may be performed to adjust the height of the top surface portion 117 of the dielectric material 116 in the STI trench 112 in anticipation of the removal of the hard mask layer 106 and pad oxide layer 104. In order for the surface of the substrate to be flat for easier and better photolithographic patterning, a portion of the dielectric material 116 in the trench 112 is removed by etch. In some embodiments, the dielectric material 116 removal is performed by a dilute HF dip. In some embodiments, the HF dip will be repeated to remove further dielectric material 116. In some embodiments, the targeted amount of dielectric material 116 removed is in a range from about 200 angstroms to about 1300 angstroms. FIG. 1G illustrates the resulting structure after the dilute HF dip, in accordance with some embodiments. In some embodiments, the dilute HF dip is prepared by mixing HF with water at a ratio, such as 50:1 water to HF. As a result of the dilute HF dip, at the corners of trench 112, a V-shaped dip 122(a), 122(b), also referred to as a STI divot, is formed owing to a high local etch rate.

Figure 1H:
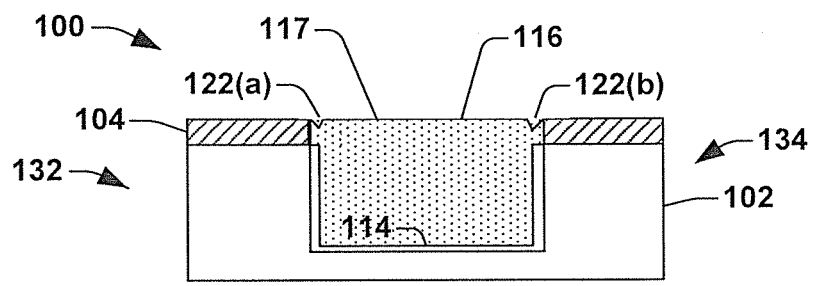
Figure 1I:
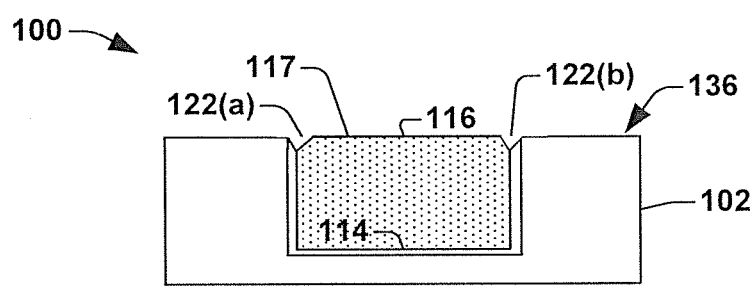

After the HF dip is performed to lower the top surface portion 117 of the dielectric material 116, the hard mask layer 106 is removed by etching, as shown in FIG. 1H. A well implant step is then performed (not shown) in active areas regions (e.g., regions 132, 134) that are adjacent to the STI trench in which the dielectric material 116 resides. Semiconductor body 100 can then undergo further processing, such as to remove the pad oxide layer 104 used in patterning and implanting the diffusion regions (not shown). The resulting structure is shown in FIG. 1I. Such removal processes can further increase the recess issue (STI divot) 122(a), 122(b). These divots 122(a), 122(b) negatively impact the photolithography of the gate patterning and possibly inter-level (ILD) gap-fill between gate structures.

Figure 1J:
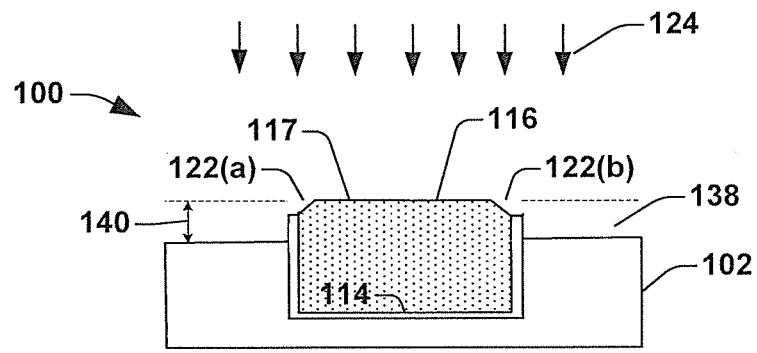

In order to address these issues, following removal of the pad oxide layer (104), a recess etch process 124 is performed to remove a top surface portion 136 of the exposed semiconductor material in the active areas adjacent the STI trench, to provide a reduced surface portion 138 of the active region, wherein an amount of removed semiconductor material is shown at reference numeral 140, as illustrated in FIG. 1J. The reduced surface portion 138, in some embodiments, is provided by the recess etch process 124, for example, a reactive ion etch for a process time of from about 10 seconds to about 100 seconds. In some embodiments, etching is performed to a predetermined depth 140 of from about 10 nm to about 30 nm.

Figure 1K:
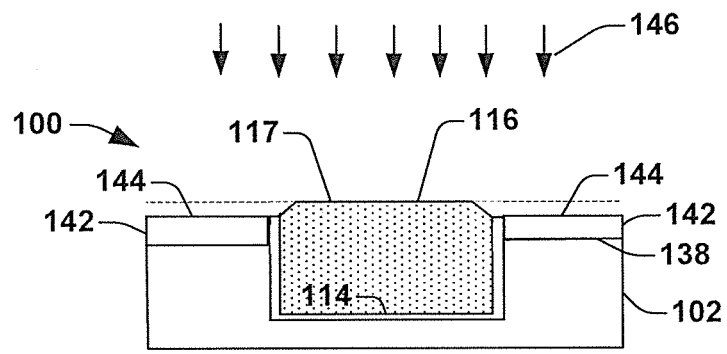

In FIG. 1K, following the recess etch process 124 to provide the reduced surface portion 138, a semiconductor layer 142 is formed overlying the reduced surface portion 138 of the active region 132, 134 of the semiconductor body 100 to define a raised surface portion 144. In some embodiments, raised surface portion 144 is formed by an epitaxial process 146. The raised surface portion 144 may include, in some embodiments, an un-doped silicon. In some embodiments, the epi growth process may include a selective epitaxy growth (SEG) process, CVD deposition techniques (e.g., vapor-phase epitaxy (VPE) and/or ultra-high vacuum CVD (UHV-CVD)), molecular beam epitaxy, other suitable epi processes, or combinations thereof. The epi process may use gaseous and/or liquid precursors. In some embodiments, the epi process may be performed for a process time of from about 200 seconds to about 500 seconds at a temperature of from about 660° C. to about 760° C. Semiconductor body 100 can then undergo further processing, for example, deposition of a thermal oxide layer overlying the epitaxially deposited semiconductor layer.

In one embodiment, as shown in FIG. 1K, the amount of semiconductor material 142 formed in the active area has a thickness 146 that is less than an amount 140 of material that was previously removed at FIG. 1J. In this manner, the divots at the STI corners are reduced and in some cases eliminated, along with the deleterious effects associated therewith. Further, as a top portion 144 of the semiconductor material 142 is lower with respect to a top portion of the STI dielectric 116, the outer diameter of the semiconductor material 142 is constrained by the STI structure, thereby reducing or eliminating bending of the semiconductor material 142, which could otherwise occur if formed at a higher level and cause uncontrolled strain (e.g., a tensile strain) that may affect carrier mobility in an uncontrolled fashion. The recess etch 124 followed by the reduced semiconductor formation (e.g., a reduced epi deposition) 146 eliminates, or at least substantially reduces, this uncontrolled bending and associated effect on carrier mobility.

Figure 1L:
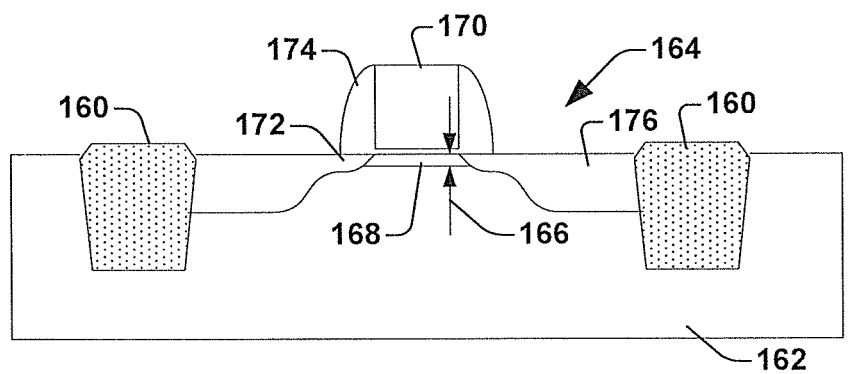
FIG. 1L is a partial cross sectional view of a MOS type transistor having a structure based on the method illustrated in FIGS. 1A-1K in accordance with one embodiment of the disclosure.

FIG. 1L illustrates a partial cross section diagram of a MOS transistor formed with the process set forth in FIGS. 1A-1K. In FIG. 1L, STI regions 160 are formed in a semiconductor body 162, and define an active area region 164 there between. In the active area region, a recess etch such as that shown in FIG. 1J is made, for example to a depth of about 25 nm, following by an epi deposition such as that illustrated in FIG. 1K, which an epi regrowth thickness 166 that is less that the recess etch depth, for example, a growth of about 18 nm. In one embodiment the epi regrowth is performed un-doped to form an intrinsic layer. A gate structure 170 is formed with extension region implants to form extension regions 172, followed by formation of spacers 174, and then a source/drain implant to form source/drain regions 176 in the active area 164. In the embodiment of FIG. 1L, the source/drain regions 176 are deeper than the intrinsic silicon region 168 in the channel portion below the gate structure 170.

Figure 2:
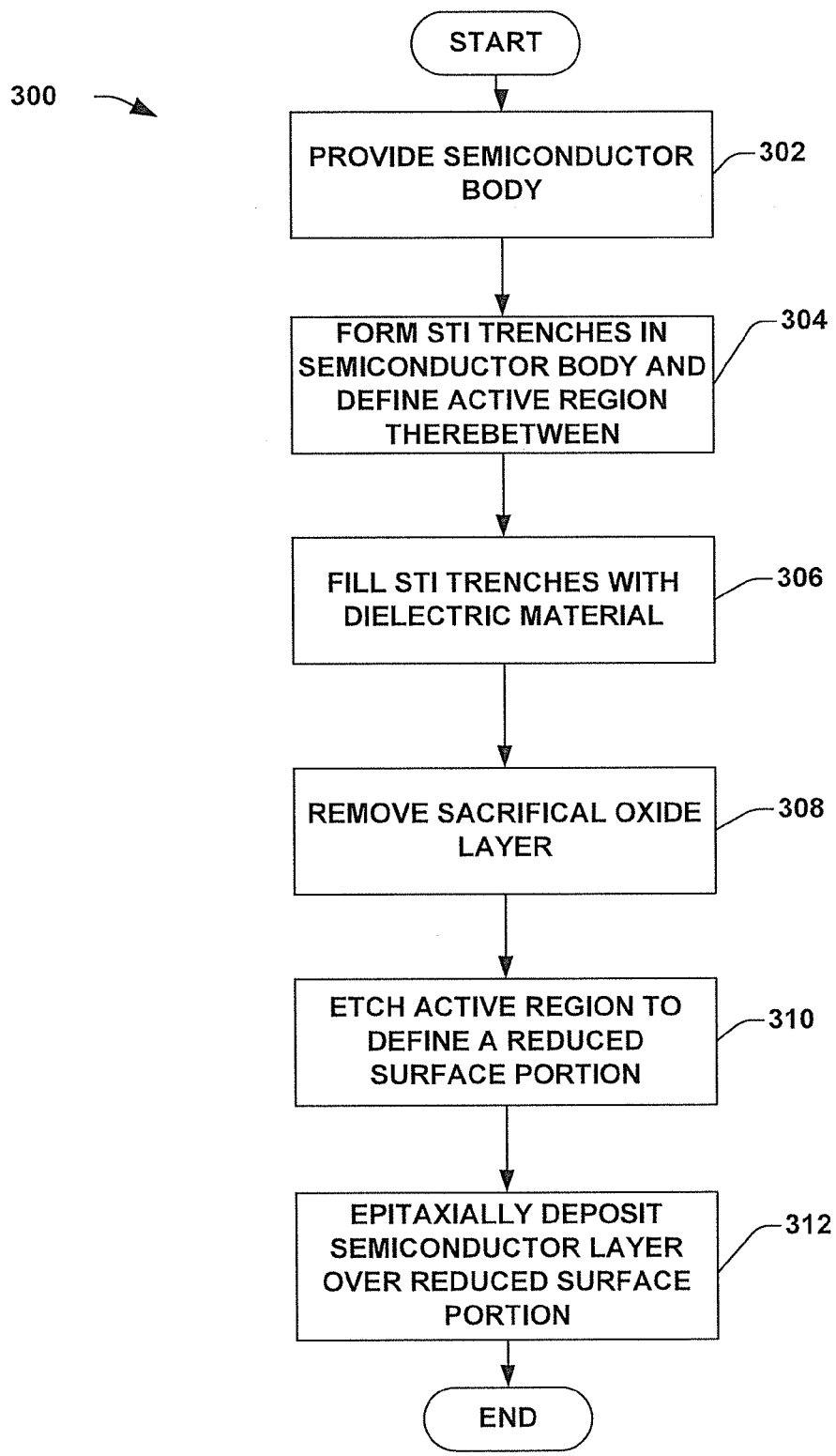
FIG. 2 is a flow diagram that shows a method similar to that of FIGS. 1A-1K for the fabrication of a device such as that illustrated in FIG. 1L in accordance with one embodiment of the disclosure.

FIG. 2 illustrates a flow diagram of a method 300 for formation of a device according to some embodiments of the disclosure. While method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302 a semiconductor body is provided. An STI trench is formed in the semiconductor body at 304. One example of such an STI trench is shown in FIGS. 1C-1D at 112.

At 306, the STI trench is filled with a dielectric material, followed by removal of a hard mask and any sacrificial oxide layer overlying the semiconductor body at 308. A resultant structure may be seen, for example, in FIG. 1I.

At 310, the active region between STI trenches is etched (i.e., a recess etch) to define a reduced surface portion. One non-limiting example of such a reduced surface portion is at 138 in FIG. 1J. At 312, a semiconductor layer is epitaxially deposited over the reduced surface portion. One example of a resultant structure with the epi portion is provided at 142 in FIG. 1K. The top surface portion of the deposited epi is below the surface of the semiconductor body prior to performing the recess etch, such that the resultant grown epi is "constrained" by the side portions of the STI regions, thereby preventing uncontrolled strains from forming in the epitaxial region in the active area. This reduction in uncontrolled strain allows for reduced mismatch in various types of transistor properties such a device threshold voltage, for example.

Figure 3:
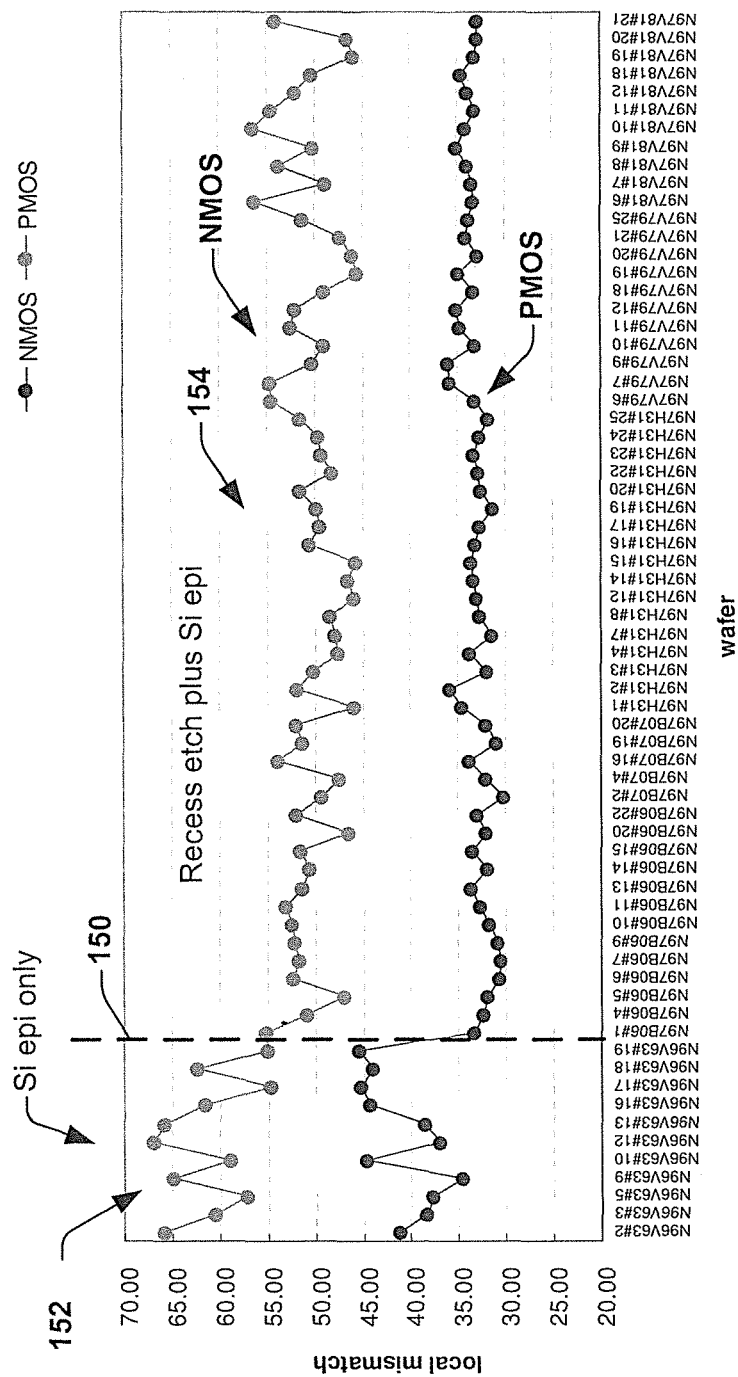
FIG. 3 is a graph that illustrates how the recess etch plus epi growth process according to one embodiment of the disclosure provides for a reduction in threshold voltage mismatch.

FIG. 3 is a graph illustrating a large number of material along the X-axis, and a measure of local mismatch along the Y-axis. As illustrated at 150, the material to the left thereof labeled "Si epi only" represents material that is formed over the active area, while the material to the right of 150 labeled "Recess etch plus Si epi" represents material in which a recess etch was performed in the active area following by an epi formation there over such that the epi is fully laterally constrained by the STI regions. As can be seen from FIG. 3, the top trace 152 shows an amount of threshold voltage (Vt) mismatch for NMOS devices, while the bottom trace 154 shows an amount of Vt mismatch for PMOS devices. FIG. 3 clearly shows that the recess etch plus Si epi process provides for better control, for example, by reducing an amount of uncontrolled straining of the intrinsic epi layer in the active region by being constrained laterally by the STI regions.

Figure 4:
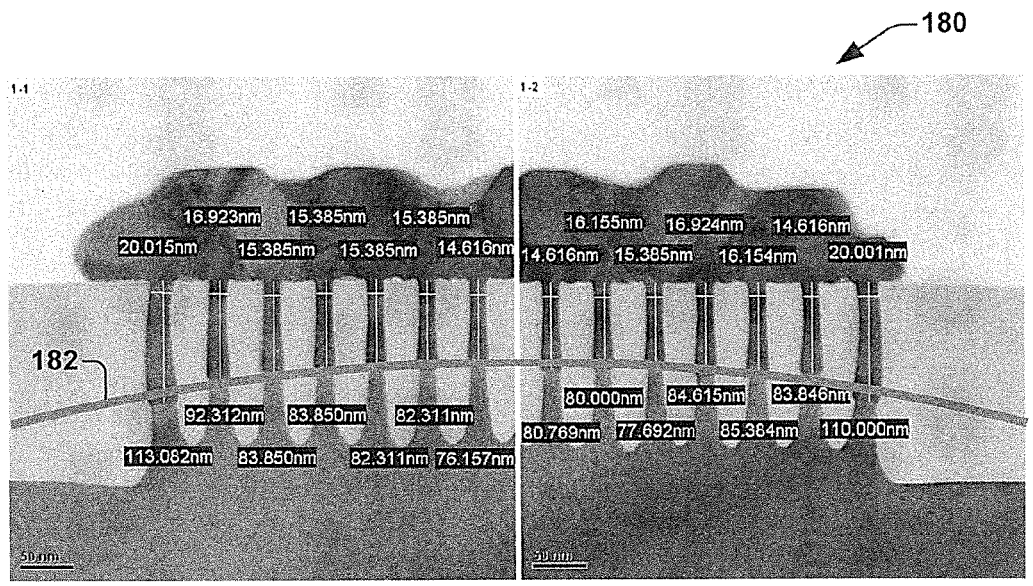
FIG. 4 is an SEM partial cross section that illustrates a loading effect in a wet etch process for forming fin type structures that results in a variation in resultant feature thickness.

It has also been found that the foregoing silicon recess etch may be utilized in other type device structures. Thus, in another embodiment, for example, a bulk fin field effect transistor (FinFETs), a plurality of fins are formed from the substrate material. The fins may be formed with different densities on the substrate. In some instances, a recess etch followed by an epi deposition in the active area can be performed prior to the formation of the fins. Conventional etch processes make it difficult to uniformly form the fins in the active area due to loading effects, and commonly result in residue left on sidewalls of the fin structures, as well as the formation of fins of non-uniform width. FIG. 4 is a scanning electron microscope (SEM) picture illustrating a plurality of fins 180, wherein the fins exhibit a substantial variation in thickness. This can be seen by the line 182 that shows a degree of loading in terms of a variation in fin width laterally across the active area. Generally, it is desirable that the resultant fins be uniform, since the size of the fin structure can in some instances have an impact on the resultant transistor device performance. Therefore having uniform fin structure can aid in providing uniform device operation.

According to one embodiment of the disclosure, a multi-step dry etch process is employed in conjunction with the recess etch and epi formation process to form a plurality of fins in the active area, wherein the fins exhibit a more uniform thickness there between.

Figure 5A:
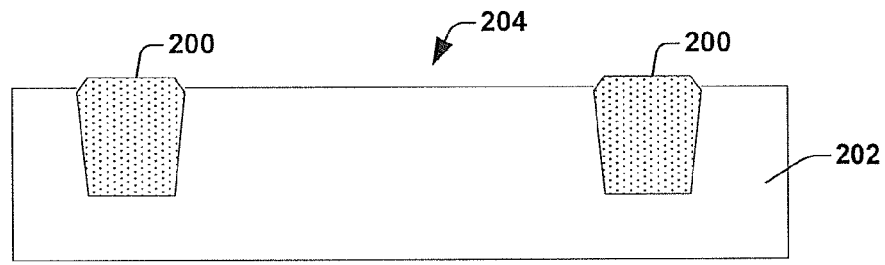
FIGS. 5A-5F are partial cross section views illustrating steps of another embodiment of forming fins for a FinFET type device using a recess etch and epi growth followed by a multi-part dry etch in accordance with the disclosure.
Figure 5B:
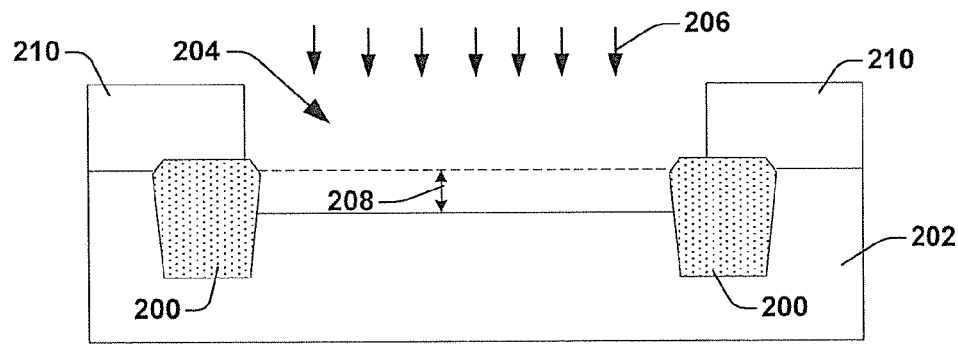

Referring to FIG. 5A, STI regions 200 are formed in a semiconductor body 202 in a manner similar to that described above in one embodiment. A region 204 interposed between the STI regions 200 is the active area. A recess etch 206 is then performed, as shown in FIG. 5B, wherein a portion 208 of the silicon body is removed. The locations in which the recess etch 206 may be performed may be delineated by forming a mask 210 prior to the etch in order to selectively expose those particular active areas in which the recess etch is to be performed.

Figure 5C:
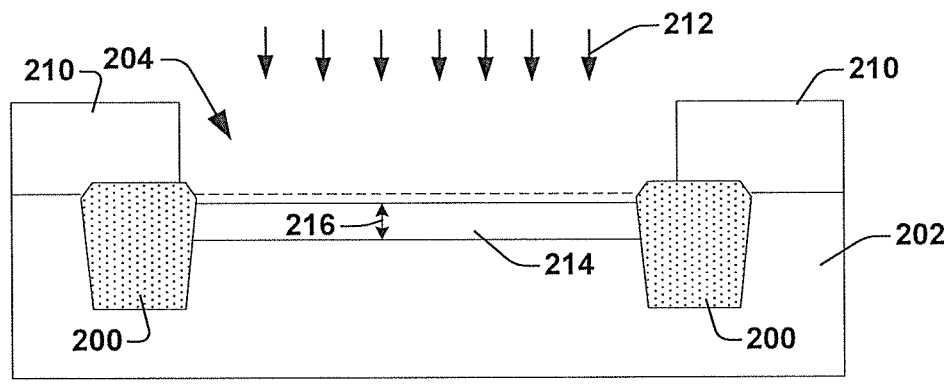

An epitaxial layer formation process 212 is then performed, as shown in FIG. 5C, to form an epitaxial layer 214 in the active area 204 over the portion that was subject to the earlier recess etch. A thickness 216 of the epitaxial layer 214 is selected to be less than a depth 208 of the recess etch, such that a top surface portion 216 of the resultant epitaxial layer 214 is lower than a top portion of the STI regions 200, and thus the epitaxial layer 214 is laterally constrained by the STI regions 200, resulting in less uncontrolled strain. In one embodiment of the disclosure, the epitaxial layer 214 is undoped, and thus comprises an intrinsic silicon layer.

Figure 5D:
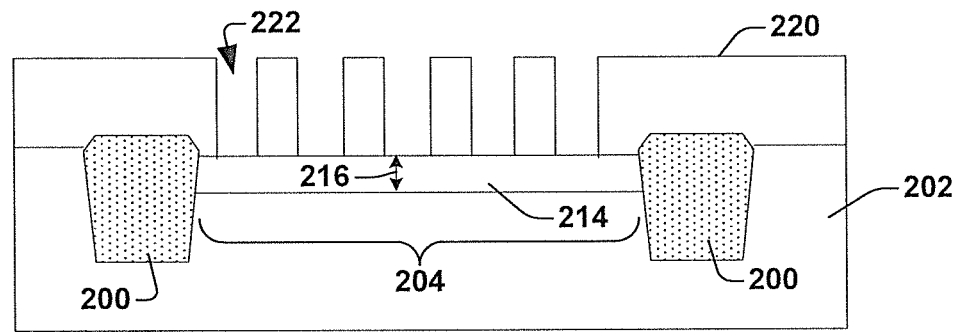
Figure 5E:
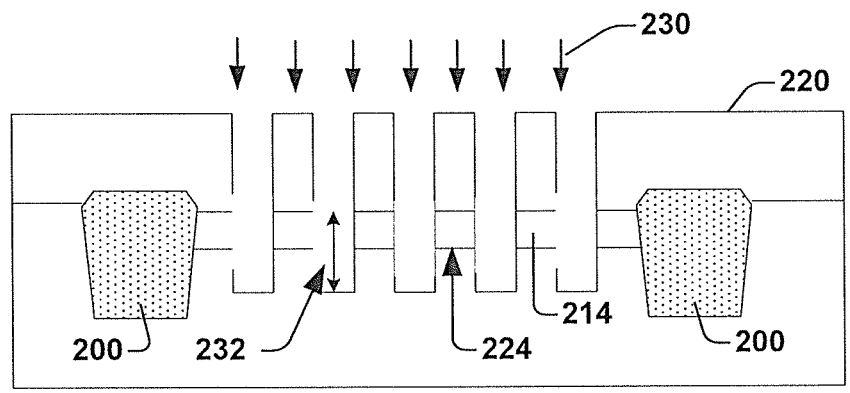

Referring now to FIG. 5D, a new mask 220 is formed over the active area 204 and patterned to form openings 222 associated with trenches to be formed in the epitaxial layer 214 and the underlying semiconductor body 202, to define the fins for FinFET devices. Referring to FIG. 5E, in order to eliminate difficulties associated with convention etch processes resulting in non-uniform fin width, according to an embodiment of the disclosure, a multi-step etch process 230 is then performed utilizing a dry etch tool to etch the intrinsic silicon layer 214 and underlying semiconductor body 202 to define the fins in the active area 204. In a first etch step of the etch process 230, a breakthrough etch is performed to break through any native oxide that has formed over the epitaxial layer 214. The breakthrough etch employs a mask, for example, a patterned photoresist mask or a patterned hard mask to define the areas to be etched. In one embodiment, the breakthrough etch process utilizes a combination of $CH_2F_2/CF_4/He$, a pressure of about 10 mT, a power of about 300 W, a bias voltage of about 40 V, a $CH_2F_2$ flow rate of about 10 sccm, a $CF_4$ flow rate of about 90 sccm, and an He flow rate of about 200 sccm. Following the breakthrough etch, using the same mask 220 of FIGS. 5D-5E, a second etch step of the etch process 230 is performed which utilizes a combination of $NF_3/He/Cl_2$, a pressure of about 80 MT, a power of about 825 W, a bias voltage of 0 V, a $NF_3$ flow rate of about 5 sccm, a He flow rate of about 200 sccm, and a $Cl_2$ flow rate of about 100 sccm. In one embodiment, the second portion of the multi-step etch process 230 is performed with no bias. The dry etching removes the exposed portions of the epitaxial layer and, depending upon the desired depth, a portion of the underlying semiconductor body 202 to form the fins 224. In one embodiment, a depth 232 of the resultant dry etch is shown in FIG. 5E, however, in other embodiments the depth may be deeper or more shallow.

Figure 5F:
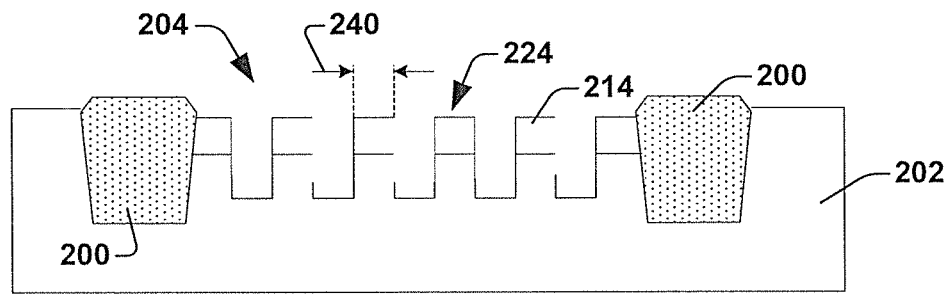

A final part of the multi-step etch process 230 is an ash, such as an $O_2$ ash that is employed to clean away any etch byproducts caused by the first two steps. In one embodiment the $O_2$ ash is performed at a pressure of 10 mT, a power of 730 W, and a voltage bias of 40V. The $O_2$ flow is 200 sccm and a chuck temperature in one embodiment (from inner to outer) is 60-60-60-60, and the ash duration is 30 seconds. In one embodiment, the $O_2$ ash removes the mask 220, particularly when the mask is a photoresist type mask, however, in another embodiment where the mask 220 is another material, a further mask removal process may be employed, resulting in the structure shown in FIG. 5F. As shown in FIG. 5F, a width 240 for each of the fins 224 is more uniform, and thus forms a tighter distribution. With a more uniform fin size, resultant FinFET device parameters are more uniform, thus providing better process control.

Figure 6:
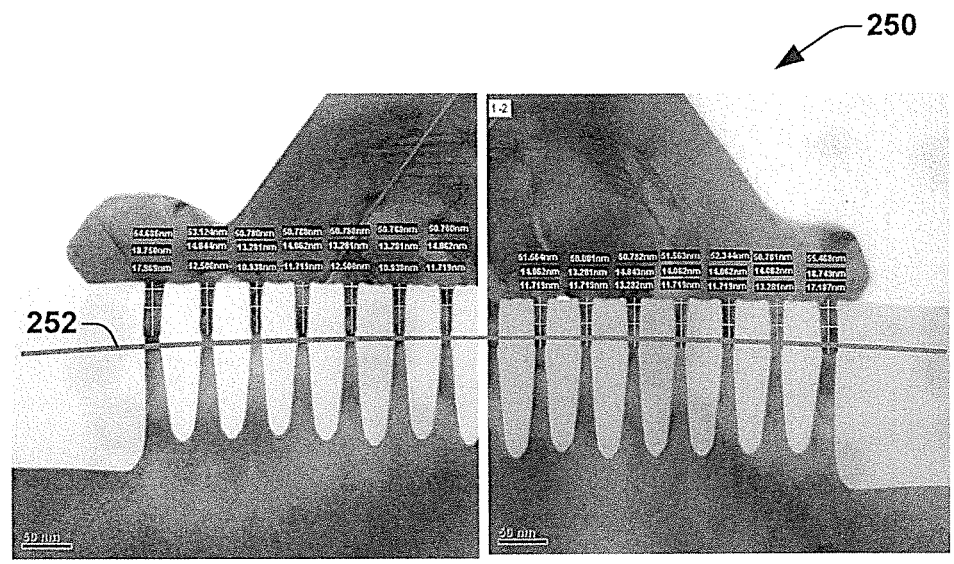
FIG. 6 illustrates a flow diagram of some embodiments of a method for the fabrication of the fins in FIGS. 5A-5E in accordance with the disclosure.

FIG. 6 is an SEM photograph illustrating a plurality of fins 250 formed by the recess etch, epi growth, and multi-step dry etch fin formation process highlighted above in FIGS. 5A-5F. As can be seen by line 252, an amount of loading induced variation in fin thickness across the active area is substantially reduced compared to the result of the conventional pattering shown in FIG. 4. In fact a slope of the angled curve 182 in FIG. 4 is about 6.1, while the slope of the curve 252 in FIG. 6 is about 0.8. As can be seen therefrom the fin formation method of FIGS. 5A-5F provide for a much greater fin dimension control, and thus in more stable, predictable FinFET operating characteristics.

Figure 7:
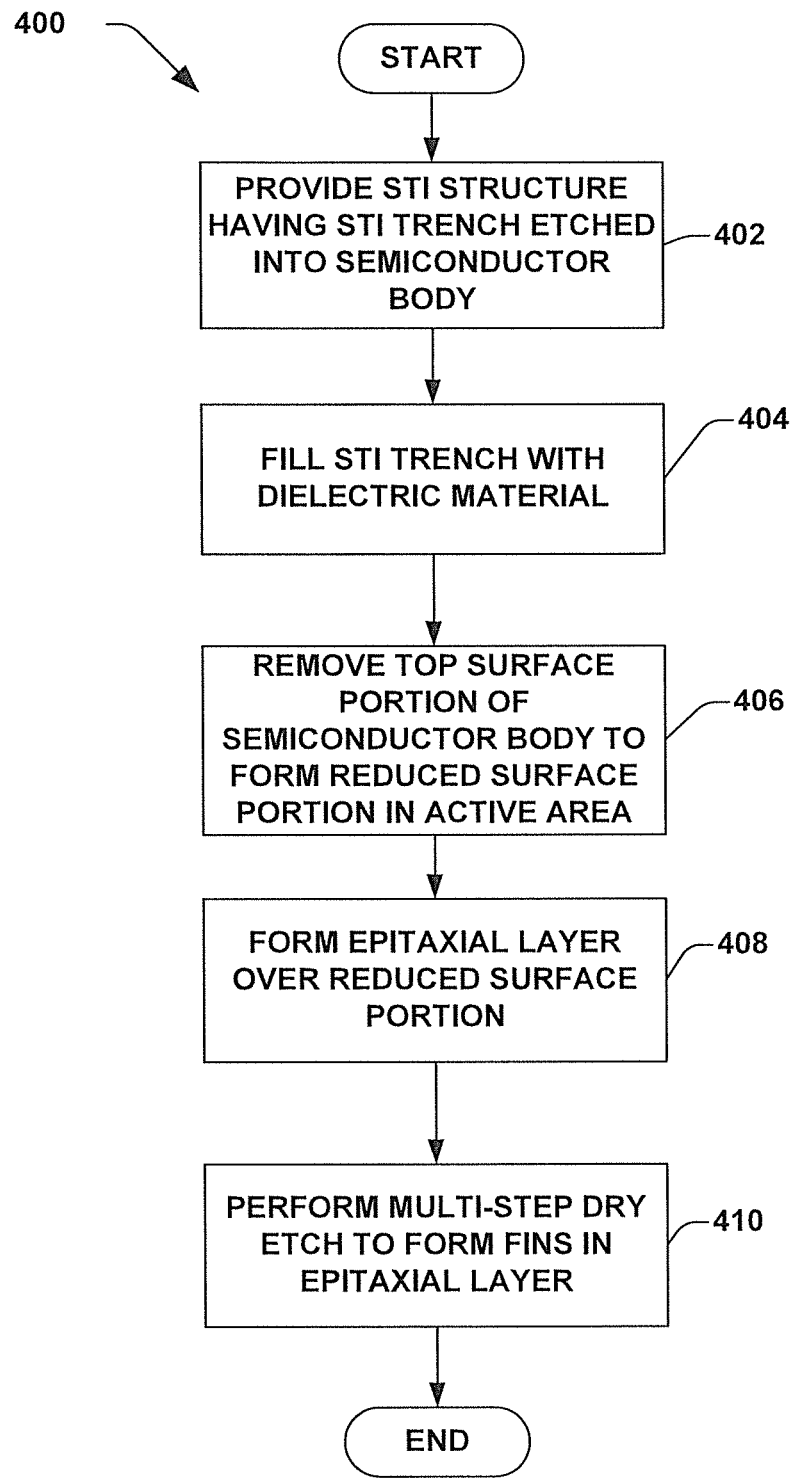
FIG. 7 illustrates a flow diagram of some embodiments of a method for the fabrication of the fins in FIGS. 5A-5F in accordance with the disclosure.

FIG. 7 illustrates a method 400 for formation of fins in an active area for formation of one or more FinFET devices according to another embodiment of the disclosure.

At 402, there is provided a plurality of STI structures comprising STI trenches etched into a semiconductor body comprising a silicon substrate having an active region there between.

At 404, the STI trenches are filled with a dielectric material. A resultant STI structure is shown for example at 200 in FIG. 5A.

At 406, a top surface portion of the semiconductor body in the active area region is etched (i.e., a recess etch) to define a reduced surface portion of the active region. An example of the resultant structure is shown in FIG. 5B.

At 408, an epitaxial layer is formed in the recess etch portion in the active area, which a thickness of the epitaxial layer is less than a depth of the recess etch. In the above manner, the epitaxial layer is laterally constrained by the STI regions in the active area. In one embodiment the epitaxial layer is formed to a thickness of about 18 nm in a recess of about 25 nm, and the epitaxial material comprises intrinsic silicon. One example of such a resultant layer is shown in FIG. 5C.

At 410, a multi-step dry etch is performed to pattern the epitaxial layer and perhaps a portion of the semiconductor body there below. In one embodiment, the multi-step etch process utilizes a dry etch tool to etch the intrinsic silicon layer and perhaps a portion of the underlying semiconductor body to define the fins in the active area. In a first etch step of the etch process at 410, a breakthrough etch is performed to break through any native oxide that has formed over the epitaxial layer. The breakthrough etch employs a mask, for example, a patterned photoresist mask or a patterned hard mask to define the areas to be etched. In one embodiment, the breakthrough etch process utilizes a combination of $CH_2F_2/CF_4/He$, a pressure of about 10 mT, a power of about 300 W, a bias voltage of about 40 V, a $CH_2F_2$ flow rate of about 10 sccm, a $CF_4$ flow rate of about 90 sccm, and an He flow rate of about 200 sccm. Following the breakthrough etch, using the same mask (e.g., mask 220 of FIGS. 5D-5E), a second etch step of the etch process at 410 is performed using a fluorine and chlorine based plasma chemistry using a helium carrier gas in a medium vacuum without a biasing of the substrate. The dry etching removes the exposed portions of the epitaxial layer and, depending upon the desired depth, a portion of the underlying semiconductor body 202 to form the fins 224. In one embodiment, a depth 232 of the resultant dry etch is shown in FIG. 5E, however, in other embodiments the depth may be deeper or more shallow.

The embodiments described above provide methods for forming STI structures which reduce or eliminate problems associated with STI divot formation, thereby overcoming electrical performance shortcomings in a completed semiconductor device.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, some embodiments of the present disclosure relate to a method. In this method, a semiconductor substrate, which has an active region disposed in the semiconductor substrate, is received. A shallow trench isolation (STI) structure is formed to laterally surround the active region. An upper surface of the active region bounded by the STI structure is recessed to below an upper surface of the STI structure. The recessed upper surface extends continuously between inner sidewalls of the STI structure and leaves upper portions of the inner sidewalls of the STI structure exposed. A semiconductor layer is epitaxially grown on the recessed surface of the active region between the inner sidewalls of the STI structure. A gate dielectric is formed over the epitaxially-grown semiconductor layer. A conductive gate electrode is formed over the gate dielectric.

Other embodiments relate to a method. In this method, a semiconductor substrate is received with an active region disposed in the semiconductor substrate. A shallow trench isolation (STI) structure that laterally surrounds the active region is formed. An entire upper surface of the active region bounded by the STI structure is recessed to below an upper surface of the STI structure. The recessed upper surface extends continuously between inner sidewalls of the STI structure and leaves upper sidewall portions of the STI structure exposed. A semiconductor layer is epitaxially grown on the recessed surface of the active region semiconductor body. An etch is performed to remove portions of the epitaxial layer in the active region to form a plurality of fins in the active region.

Still other embodiments relate to a method. In this method, a silicon substrate with an active region disposed in the silicon substrate is received. A shallow trench isolation (STI) structure that laterally surrounds the active region is formed. An upper surface of the active region bounded by the STI structure is recessed to below an upper surface of the STI structure. The recessed upper surface extends continuously between inner sidewalls of the STI structure and leaves upper sidewall portions of the STI structure exposed. A silicon layer is epitaxially grown on the recessed surface of the active region. The epitaxially-grown silicon layer has an upper surface which is convex and which meets a plane corresponding to an upper surface of the silicon substrate at an angle of about 0.8 degrees.

The disclosure further relates to a method of forming a semiconductor arrangement, comprising providing an STI structure comprising two STI trenches etched into a semiconductor body comprising a silicon substrate having an active area region there between, and filling the STI trenches with a dielectric material. The method further comprises removing a top surface portion of the semiconductor material in the active area region to define a reduced surface portion of the active area region, and forming an un-doped epitaxial layer over the reduced surface portion in the active area region. The method further comprises forming a patterned mask to define a plurality of regions in the active area region, and patterning the un-doped epitaxial layer in the active area region to form one or more fins in the active area region. In one embodiment patterning the un-doped epitaxial layer comprises performing a breakthrough etch using a mask with a combination of $CH_2F_2/CF_4/He$, a pressure of about 10 mT, a power of about 300 W, a bias voltage of about 40 V, a $CH_2F_2$ flow rate of about 10 sccm, a $CF_4$ flow rate of about 90 sccm, and an He flow rate of about 200 sccm, followed by performing a zero bias etch of the un-doped epitaxial layer comprising a combination of $NF_3/He/Cl_2$, a pressure of about 80 MT, a power of about 825 W, a bias voltage of 0 V, a $NF_3$ flow rate of about 5 sccm, a He flow rate of about 200 sccm, and a $Cl_2$ flow rate of about 100 sccm. The multi-step dry etch process may further comprise performing an oxygen ashing to remove etch byproducts after performing the multi-step dry etch process.

What is claimed is:
1. A method, comprising:
receiving a semiconductor substrate with an active region disposed in the semiconductor substrate;
forming a shallow trench isolation (STI) structure that laterally surrounds the active region;
recessing an upper surface of the active region bounded by the STI structure to below an upper surface of the STI structure, wherein the recessed upper surface extends continuously between inner sidewalls of the STI structure and leaves upper portions of the inner sidewalls of the STI structure exposed;
epitaxially growing a semiconductor layer which is in direct contact with the recessed surface of the active region and the inner sidewalls of the STI structure and which exhibits an absence of germanium;
forming a gate dielectric over the epitaxially-grown semiconductor layer; and
forming a conductive gate electrode over the gate dielectric.

2. The method of claim 1, wherein the gate dielectric is formed by a thermal oxidation of the epitaxially-grown semiconductor layer.

3. The method of claim 1, further comprising:
forming first and second source/drain regions in the semiconductor substrate on opposite sides of the conductive gate electrode.

4. The method of claim 3, wherein lowermost portions of the first and second source/drain regions extend deeper into the semiconductor substrate than a lowermost portion of the epitaxially-grown semiconductor layer.

5. The method of claim 1, wherein the epitaxially-grown semiconductor layer is formed to a thickness that leaves an upper surface of the epitaxially-grown semiconductor layer beneath a plane corresponding to an upper surface of the STI structure.

6. The method of claim 1, wherein the epitaxially-grown semiconductor layer has an upper surface residing below an upper surface of the semiconductor substrate.

7. The method of claim 1, wherein the STI structure has an upper surface extending above the upper surface of the semiconductor substrate.

8. The method of claim 1, wherein the upper surface of the active region is recessed by approximately 25 nanometers.

9. The method of claim 1, wherein the epitaxially-grown semiconductor layer has an upper surface which is convex and which meets a plane corresponding to an upper surface of the semiconductor substrate at an angle of about 0.8 degrees.

10. The method of claim 8, wherein the epitaxially-grown semiconductor layer has a thickness of about 18 nanometers.

11. A method, comprising:
receiving a semiconductor substrate with an active region disposed in the semiconductor substrate;
forming a shallow trench isolation (STI) structure that laterally surrounds the active region;
recessing an entire upper surface of the active region bounded by the STI structure to below an upper surface of the STI structure, wherein the recessed upper surface extends continuously between inner sidewalls of the STI structure and leaves upper sidewall portions of the STI structure exposed;
epitaxially growing a semiconductor layer on the recessed surface of the active region semiconductor body;

performing an etch to remove portions of the epitaxial layer in the active region to form a plurality of fins in the active region.

12. The method of claim 11, wherein the etch comprises a multi-step etch process, comprising: performing a breakthrough etch to remove any native oxide; and performing a zero bias etch of the epitaxially-grown layer comprising a combination of fluorine and chlorine with a helium carrier gas.

13. The method of claim 11, wherein the epitaxially-grown semiconductor layer has an upper surface which is convex and which meets a plane corresponding to an upper surface of the semiconductor substrate at an angle of about 0.8 degrees.

14. A method, comprising:
receiving a silicon substrate with an active region disposed in the silicon substrate;
forming a shallow trench isolation (STI) structure that laterally surrounds the active region;
recessing an upper surface of the active region bounded by the STI structure to below an upper surface of the STI structure, wherein the recessed upper surface extends continuously between inner sidewalls of the STI structure and leaves upper sidewall portions of the STI structure exposed;
epitaxially growing a silicon layer on the recessed surface of the active region;
wherein the epitaxially-grown silicon layer has an upper surface which is convex and which meets a plane corresponding to an upper surface of the silicon substrate at an angle of about 0.8 degrees.

15. The method of claim 14, further comprising:
forming a gate dielectric over the epitaxially-grown silicon layer; and
forming a conductive gate electrode over the gate dielectric.

16. The method of claim 15, wherein the gate dielectric is formed by a thermal oxidation of the epitaxially-grown silicon layer.

17. The method of claim 15, further comprising:
forming first and second source/drain regions in the silicon substrate on opposite sides of the conductive gate electrode, wherein lowermost portions of the source/drain regions extend deeper into the silicon substrate than a lowermost portion of the epitaxially-grown silicon layer.

18. The method of claim 14, further comprising:
performing an etch to remove portions of the epitaxially grown silicon layer in the active region to form a plurality of fins in the active region.

19. The method of claim 14, wherein the etch comprises a multi-step etch process, comprising: performing a breakthrough etch to remove any native oxide; and
performing a zero bias etch of the epitaxially-grown silicon layer comprising a combination of fluorine and chlorine with a helium carrier gas.

20. The method of claim 14, wherein the epitaxially grown silicon layer is formed to be in direct contact with the recessed surface of the active region.

* * * * *